(12) United States Patent
Marino et al.

(10) Patent No.: US 9,629,257 B2
(45) Date of Patent: *Apr. 18, 2017

(54) INTELLIGENT SOLDERING CARTRIDGE FOR AUTOMATIC SOLDERING CONNECTION VALIDATION

(71) Applicant: OK International Inc., Cypress, CA (US)

(72) Inventors: Kenneth D. Marino, Long Beach, CA (US); Hoa Nguyen, Santa Ana, CA (US)

(73) Assignee: OK INTERNATIONAL, INC., Cypress, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/333,590

(22) Filed: Oct. 25, 2016

(65) Prior Publication Data

US 2017/0042042 A1    Feb. 9, 2017

Related U.S. Application Data

(63) Continuation of application No. 15/096,035, filed on Apr. 11, 2016, now Pat. No. 9,511,439, which is a
(Continued)

(51) Int. Cl.
| | |
|---|---|
| *B23K 1/00* | (2006.01) |
| *B23K 3/00* | (2006.01) |
| *B23K 3/02* | (2006.01) |
| *B23K 31/02* | (2006.01) |
| *H05K 3/34* | (2006.01) |
| *B23K 3/03* | (2006.01) |
| *B23K 3/047* | (2006.01) |

(Continued)

(52) U.S. Cl.
CPC ............... *H05K 3/34* (2013.01); *B23K 3/033* (2013.01); *B23K 3/0478* (2013.01); *B23K 31/125* (2013.01); *B23K 2201/42* (2013.01); *H05K 2203/04* (2013.01)

(58) Field of Classification Search
CPC ........ B23K 3/033; B23K 3/03; B23K 3/0471; B23K 3/0478; B23K 3/08
USPC ......... 228/51, 55, 8, 102, 103, 119, 233.2, 9
See application file for complete search history.

(56) References Cited

U.S. PATENT DOCUMENTS

| | | |
|---|---|---|
| 4,418,268 A | 11/1983 | Munshaw |
| 4,792,078 A | 12/1988 | Takahashi |
| (Continued) | | |

*Primary Examiner* — Erin Saad
(74) *Attorney, Agent, or Firm* — Lewis Roca Rothgerber Christie LLP

(57) ABSTRACT

An intelligent soldering cartridge that includes: a housing; a solder tip; a heater for heating the solder tip; a storage device for storing information about characteristics of the cartridge; a processor for retrieving the information about characteristics of the cartridge, monitoring the power level delivered to the solder tip to detect liquidus occurrence at a solder joint, determining a thickness of an intermetallic compound (IMC) of the solder joint using some of the retrieved information, determining whether the thickness of the IMC is within a predetermined range, and generating an indication signal indicating that a reliable solder joint connection is formed when the thickness of the IMC is within the predetermined range; and an interface for transmitting the indication signal.

20 Claims, 15 Drawing Sheets

Related U.S. Application Data continuation of application No. 14/966,975, filed on Dec. 11, 2015, now Pat. No. 9,327,361, which is a continuation-in-part of application No. 14/794,678, filed on Jul. 8, 2015, now Pat. No. 9,516,762.

(60) Provisional application No. 62/033,037, filed on Aug. 4, 2014.

(51) Int. Cl.
*B23K 31/12* (2006.01)
*B23K 101/42* (2006.01)

(56) References Cited

U.S. PATENT DOCUMENTS

| | | | |
|---|---|---|---|
| 4,801,069 A | 1/1989 | Ankrom et al. | |
| 5,495,093 A | 2/1996 | Griffith | |
| 5,928,536 A | 7/1999 | Lee | |
| 6,563,087 B1 | 5/2003 | Yokoyama et al. | |
| 6,580,050 B1 | 6/2003 | Miller et al. | |
| 6,946,623 B2 | 9/2005 | Evanyk | |
| 7,044,354 B2 | 5/2006 | Tetuo et al. | |
| 7,780,060 B2 | 8/2010 | Fitzsimmons et al. | |
| 8,274,011 B2 | 9/2012 | Masaki | |
| 8,288,868 B2 | 10/2012 | Seko | |
| 8,733,620 B2 | 5/2014 | Renavikar et al. | |
| 9,327,361 B2 * | 5/2016 | Marino | B23K 3/0471 |
| 9,511,439 B2 * | 12/2016 | Marino | B23K 3/0471 |
| 9,516,762 B2 * | 12/2016 | Marino | B23K 1/0016 |

\* cited by examiner

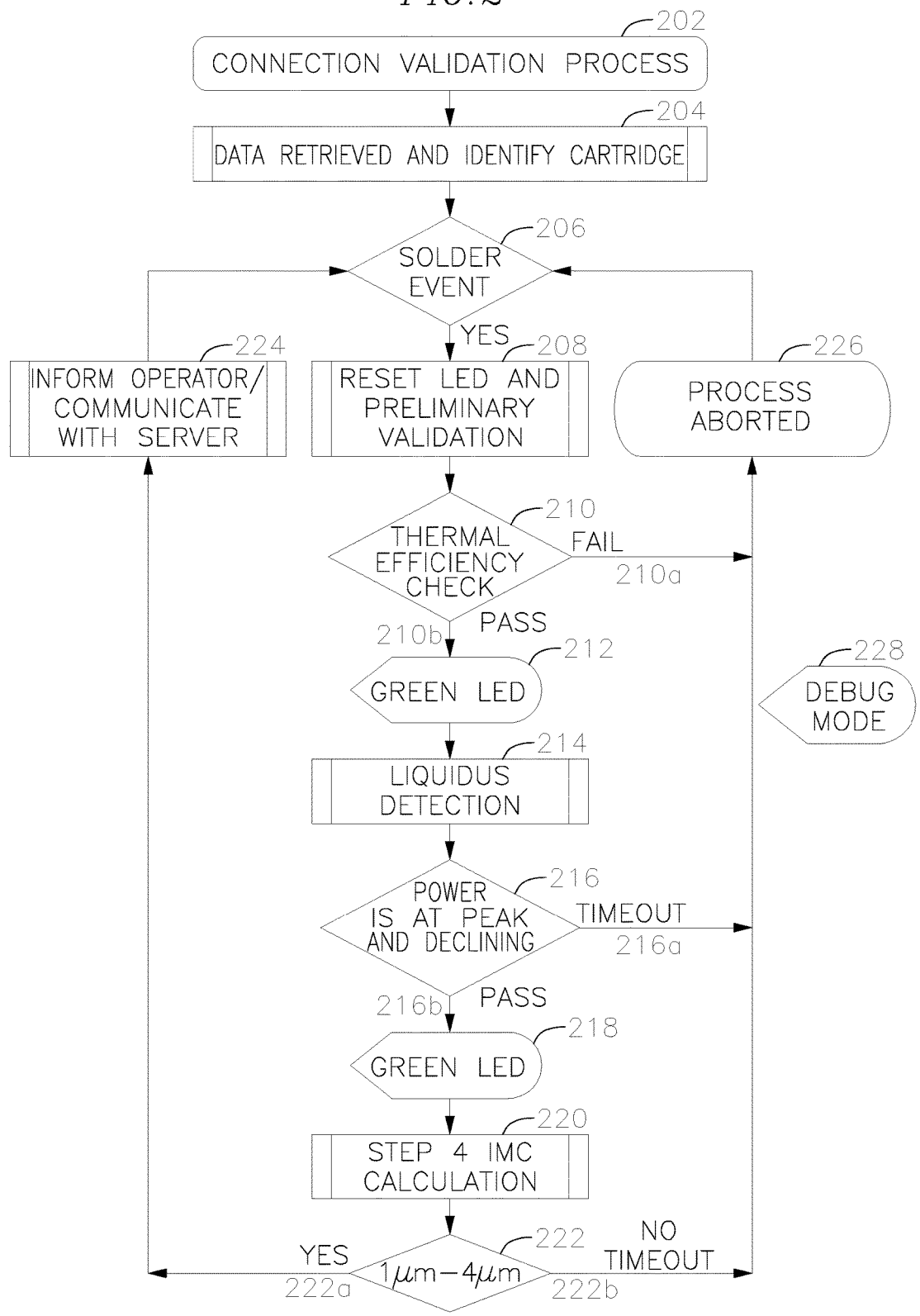

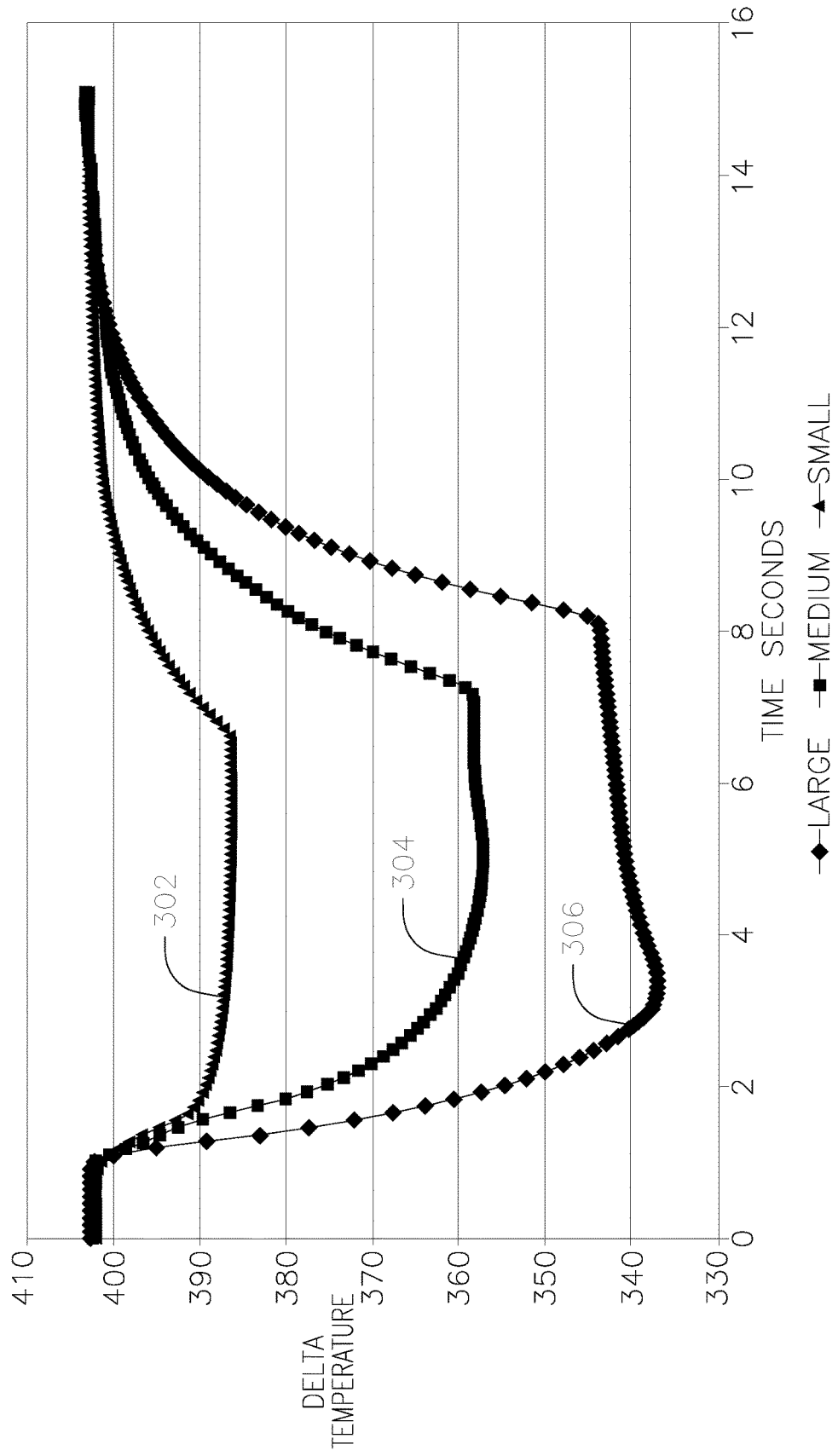

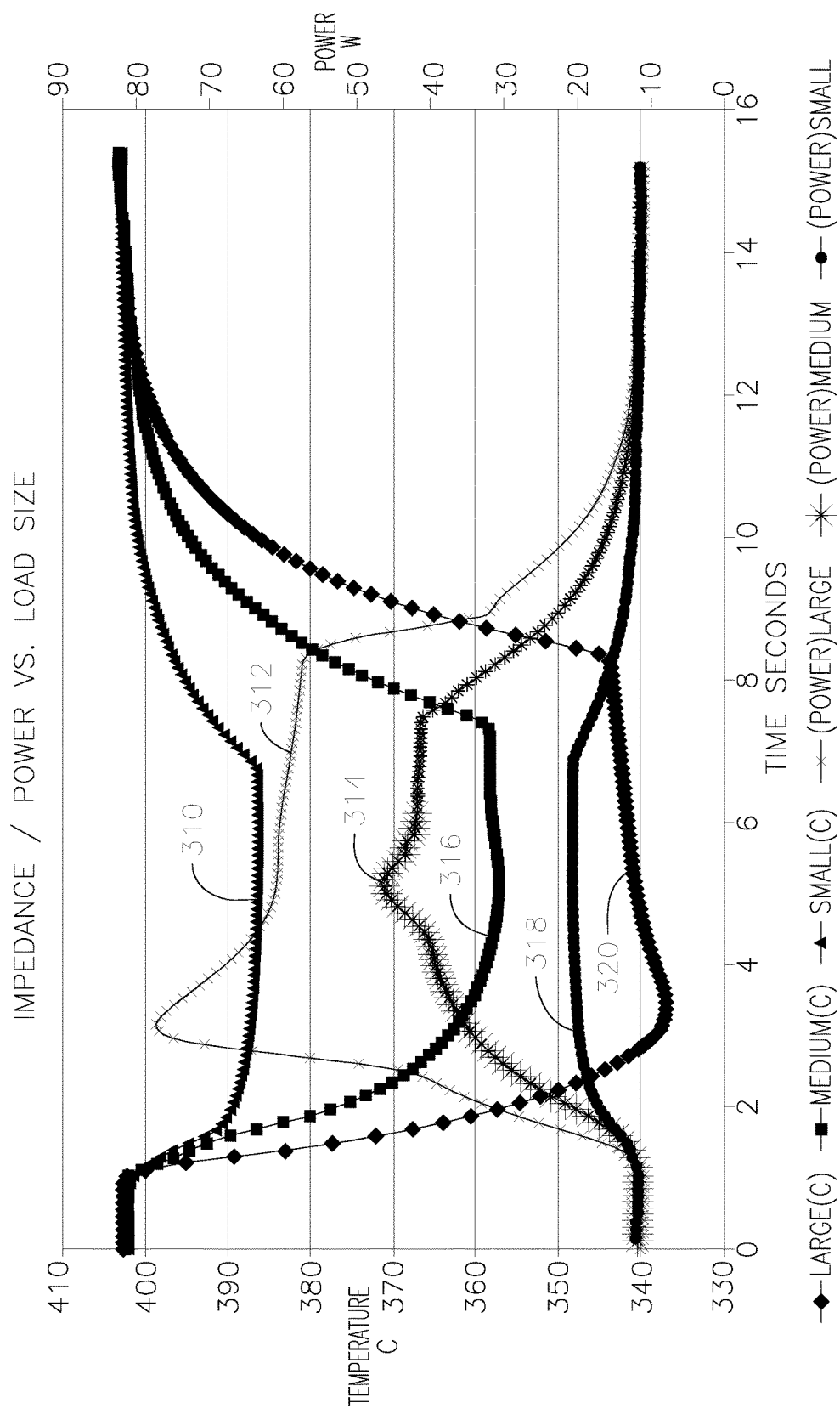

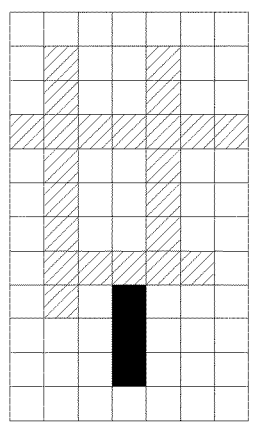
FIG.6A
SAMPLE
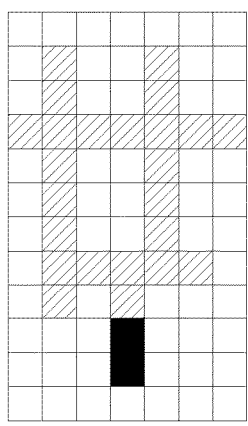
FIG.6B
CURRENT
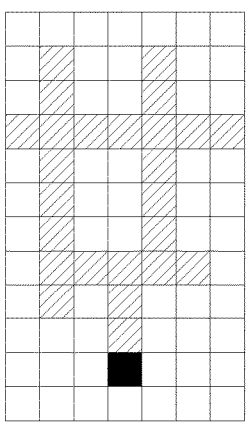
FIG.6C
CURRENT
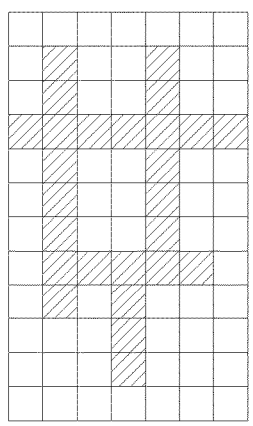
FIG.6D
LIQUIDUS
DETECTED
FIG.7A
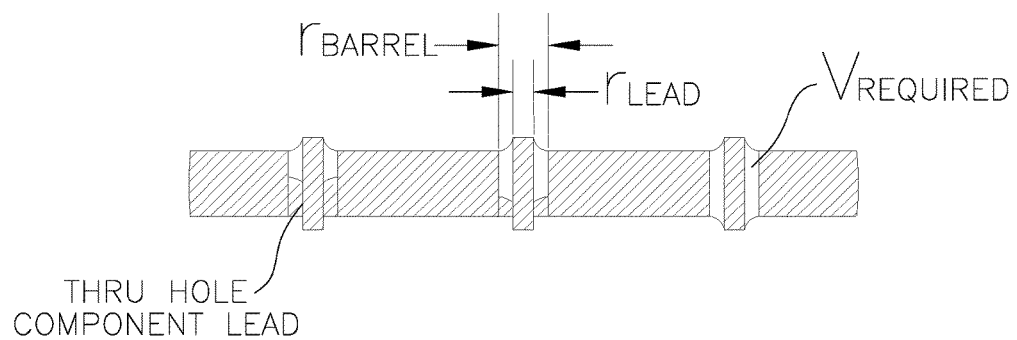
FIG.7B
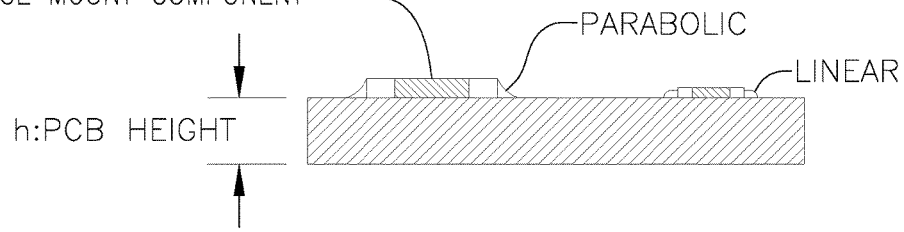

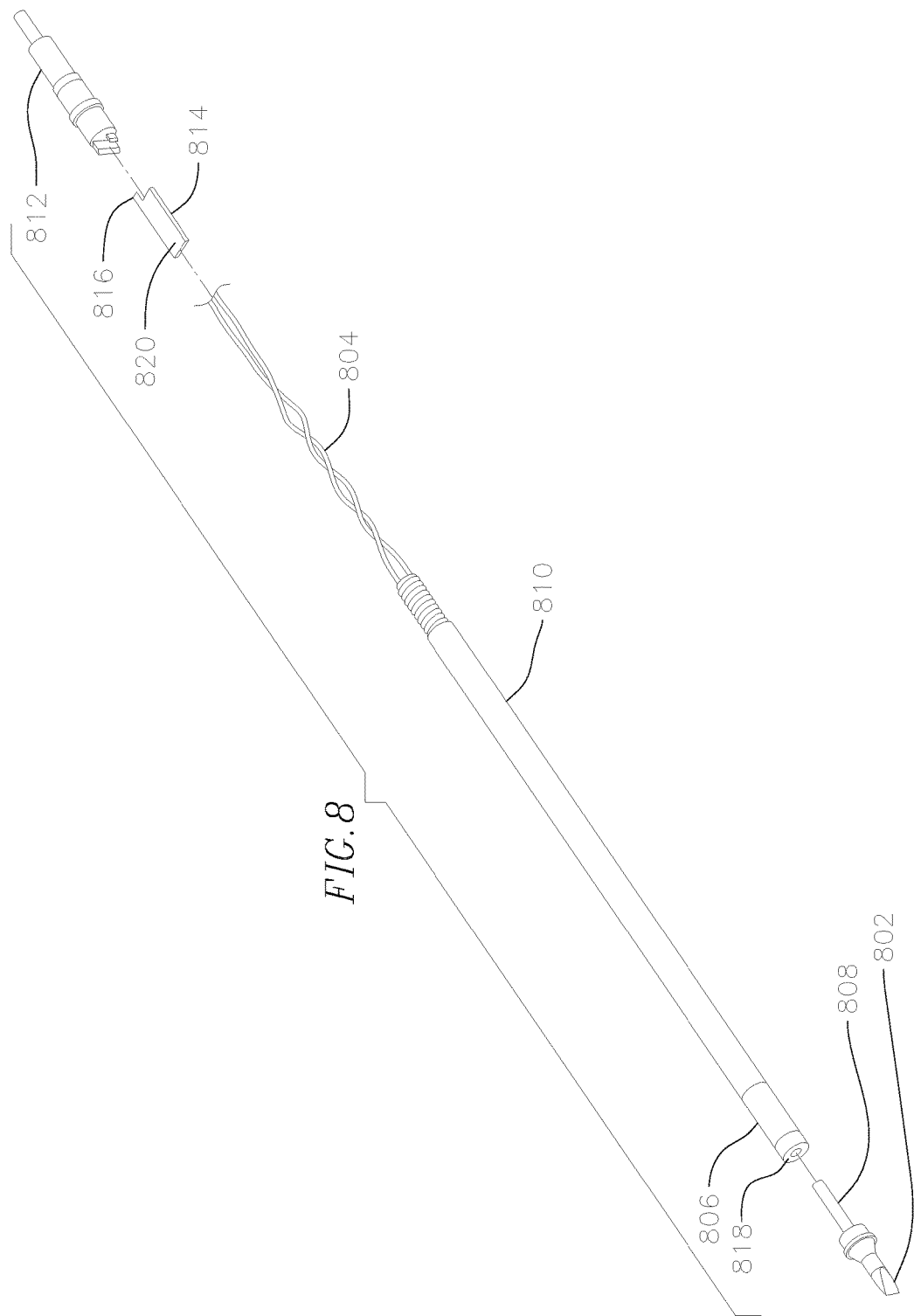

INTELLIGENT SOLDERING CARTRIDGE FOR AUTOMATIC SOLDERING CONNECTION VALIDATION

CROSS-REFERENCE TO RELATED APPLICATIONS

This Patent Application is a Continuation of patent application Ser. No. 15/096,035, filed on Apr. 11, 2016, which is a Continuation of patent application Ser. No. 14/966,975, filed on Dec. 11, 2015, which is a Continuation-In-Part of patent application Ser. No. 14/794,678, filed on Jul. 8, 2015 and entitled "Soldering Iron With Automatic Soldering Connection Validation," which claims the benefit of the filing date of U.S. Provisional Patent Application Ser. No. 62/033,037, filed on Aug. 4, 2014 and entitled "Connection Validation For Handheld Soldering Iron Station," the entire contents of all of which are herein expressly incorporated by reference.

FIELD OF THE INVENTION

The present invention relates generally to manufacturing, repair and rework of printed circuit boards (PCBs), and more particularly to a soldering station with automatic soldering connection validation.

BACKGROUND

With the greater variety of components used on printed circuit boards (PCBs), smaller passive components and larger ICs with finer ball pitch dimensions, the demands on high quality solder joints to aid PCB assembly (PCBA) fabrication and rework have increased. Faulty solder joint has cost companies billions of dollars over the years. Many processes have been developed to reduce failure rate for wave solder systems. However, for point to point handheld soldering and rework applications, companies are relying on operators' skills to produce good solder joints with quality electrical connections. Regardless of how much training is provided to the operators of the soldering iron, without guidance during a soldering activity, the operators may make and repeat mistakes due to the fact that there are many factors that impact heat transfer by the soldering iron for forming a solder joint with good electrical connection. These factors include solder tip temperature, geometry of the solder tip, oxidation of the solder, human behavior, and the like.

Moreover, automatic (e.g., robotic) soldering is currently strictly an open-loop time based event, where a robot moves to the specific joint, the solder tip is automatically placed on the joint, solder is automatically applied, and a prescribed time later (determined by a specific software for the robot), the solder tip is automatically removed from the joint. This process is repeated until the robot's program is complete. This open-loop time based event can be significantly improved by using the various embodiments of connection validation (CV) technology disclosed herein, with a real-time feedback of the solder quality.

SUMMARY

In some embodiments, the present invention is an intelligent soldering cartridge that includes: a housing; a solder tip; a heater for heating the solder tip; a storage device for storing information about characteristics of the cartridge; a processor for retrieving the information about characteristics of the cartridge, monitoring the power level delivered to the solder tip to detect liquidus occurrence at a solder joint, determining a thickness of an intermetallic compound (IMC) of the solder joint using some of the retrieved information, determining whether the thickness of the IMC is within a predetermined range, and generating an indication signal indicating that a reliable solder joint connection is formed when the thickness of the IMC is within the predetermined range; and an interface for transmitting the indication signal.

In some embodiments, the present invention is an intelligent soldering cartridge that includes: a housing; a solder tip; a heater for heating the solder tip; a storage device for storing information about characteristics of the cartridge; a processor for retrieving the information about characteristics of the cartridge, detecting liquidus occurrence at a solder joint, receiving a 3D current image of the solder joint, determining volume of the dispensed solder after occurrence of the liquidus from the 3D current image, comparing the volume of the dispensed solder to an amount of solder needed to fill in a barrel of a hole for a through hole component, or to fill in a surface of a barrel of a hole for a surface mount component to determine how much of the dispensed solder is dissipated onto the barrel or on the surface area of the barrel, repeating the comparing of the volume of the dispensed solder until the dispensed solder has filled the barrel or the surface area of the barrel, and generating an indication signal indicating that a reliable solder joint connection is formed when the dispensed solder has filled the barrel or the surface area of the barrel within the predetermined tolerance; and an interface for transmitting the indication signal.

The interface may be a wireless and/or wired interface. In some embodiments, the cartridge includes a temperature sensor for measuring a temperature of the solder tip, where the temperature sensor periodically measures the temperature of the solder tip and feeds the information to the processor, and wherein the processor adjusts the temperature of the solder tip when said temperature changes from a predetermined value.

The intelligent soldering cartridge of the present invention may be used in a handheld soldering iron or an automatic soldering station for soldering work pieces.

BRIEF DESCRIPTION OF THE DRAWINGS

FIG. 2 shows an exemplary process flow, according to some embodiments of the present invention.

FIG. 3A shows a graph for a change in temperature of a soldering tip over time, for three given load sizes, according to some embodiments of the present invention.

FIG. 3B depicts a graph for a change in impedance of a soldering tip over time, for three given power levels and three given temperatures, according to some embodiments of the present invention.

FIGS. 6A-6D show various images used for detection of liquidus, according to some embodiments of the present invention.

FIG. 7A shows some exemplary solder joints for through hole components, according to some embodiments of the present invention.

FIG. 7B depicts some exemplary solder joints for surface mount components, according to some embodiments of the present invention.

FIG. 8 shows an exemplary intelligent soldering cartridge, according to some embodiments of the present invention.

DETAILED DESCRIPTION

In some embodiments, the present invention is a soldering station with automatic soldering connection validation. The soldering station includes a processor, such as a microprocessor or controller, memory, input/output circuitry and other necessary electronic circuitry to perform the soldering connection validation.

In some embodiments, the processor receives various characteristics of the solder joint and soldering station and performs a process of calculating the intermetallic compound (IMC) thickness of solder and PCB substrate to ensure a good solder joint is formed during a soldering event. Once a good electrical connection for the solder joint is confirmed, an audio, LED, or vibration indicator in the soldering station, for example, in a handpiece or on a display in a soldering station, informs the operator or a soldering robot program of the formation of the good solder joint. Typically, a good solder joint formed by SAC (tin-silver-copper) solder and copper substrate PCB is when the intermetallic thickness of the solder is between 1 um-4 um. Accordingly, if the soldering station uses, for example, SAC305 (96.5% Sn, 3% Ag, 0.5% Cu) solder wire with copper substrate PCB, the IMC thickness of the $Cu_6Sn_5$ is calculated by some embodiments of the present invention and the operator or the robot is notified once the IMC thickness of the solder reaches 1 um-4 um, during the soldering event.

The chemical reaction between the copper substrate and the soldering can be shown as:

$$3Cu+Sn \rightarrow Cu_3Sn \text{ (phase 1)} \quad (1)$$

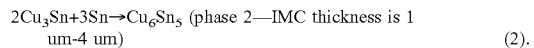

$$2Cu_3Sn+3Sn \rightarrow Cu_6Sn_5 \text{ (phase 2—IMC thickness is 1 um-4 um)} \quad (2).$$

Phase 1 of the chemical reaction is temporary (transient) and therefore is not used for determination of the quality of the solder joint.

Figure 1A:
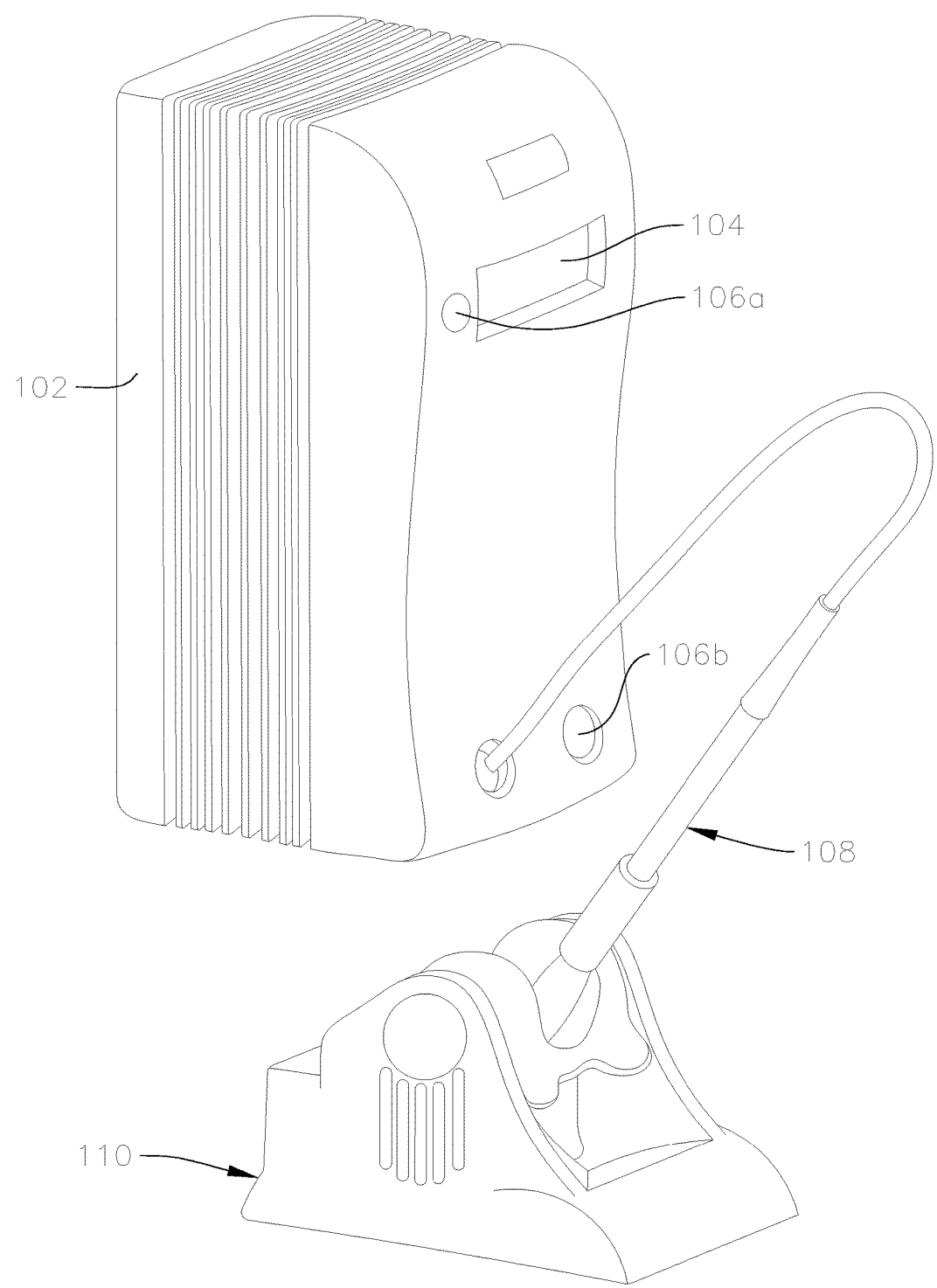
FIG. 1A depicts an exemplary handheld soldering iron, according to some embodiments of the present invention.

FIG. 1A depicts an exemplary handheld soldering iron, according to some embodiments of the present invention. As shown, the handheld soldering iron includes a power supply unit 102 including a display 104, for example an LCD display, and various indicators 106, such as LED indicators 106a and 106b. Other indicators, such as sound-emitting devices or haptic devices can be used as well. The soldering iron further includes a handpiece 108 coupled to the power supply unit 102 and a (work) stand 11 that accommodates the handpiece 108. The handpiece 108 receives power from the power supply unit 102 and heats a soldering tip attached to or located in a soldering cartridge to perform the soldering on a work piece. In some embodiments, the soldering cartridge may include a temperature sensor thermally coupled to the soldering tip to sense the tip temperature and transmit that data to a processor.

The handpiece 108 may include various indicators such as one or more LEDs and/or a buzzer on it. In some embodiments, the power supply unit 102 or the handpiece 108 includes a microprocessor, memory, input/output circuitry and other necessary electronic circuitry to perform various processes. One skilled in the art would recognize that the microprocessor (or the controller) may be placed in the power supply, in the handpiece, or a stand of the soldering system. Communication with external devices, such as a local computer, a remote server, a robot for performing the soldering, a printer and the like, may be performed at the work stand by wired and/or wireless connections, using the known wired and/or wireless interfaces and protocols.

In some embodiments, the microprocessor and the associated circuits identify what soldering cartridge is being used, validate the tip geometry, validate that the temperature and load (solder joint) are matched to ensure that the selected soldering cartridge can produce sufficient energy to bring the load to the melting point of the solder, detect liquidus temperature and then determine the IMC thickness of the solder, as described in more detail below. For example, if the tip geometry is too small for the load, the tip would not be able to bring the joint to the solder melting point. The liquidus temperature is the temperature above which a material is completely liquid. Liquidus temperature is mostly used for impure substances (mixtures) such as glasses, alloys and rocks. Above the liquidus temperature the material is homogeneous and liquid at equilibrium. Below the liquidus temperature, crystals are formed in the material after a sufficient time, depending on the material.

FIG. 8 shows an exemplary intelligent soldering cartridge, according to some embodiments of the present invention. In some embodiments, the intelligent soldering cartridge includes a soldering tip 802, associated wiring 804, a magnetic shield 806, a heater 808 to heat the tip, a shaft or housing 810, connector(s) 812 for both electrical and mechanical connections and a storage device 814 such as a non-volatile memory (NVM). The intelligent soldering cartridge may further include one or more sensors 818, such as temperature sensor to measure the temperature of the tip and/or a potentiometer to measure the impedance of the tip, a radio frequency identification device (RFID) 820, and/or a processor and associated circuitry 816 such as input/output circuits and wired and/or wireless interfaces to data communication. The mechanical connector (not shown) for connecting the cartridge to a hand-piece or robot arm may be included for efficient, quick-release operation.

In some embodiments, the cartridge ID, for example, a serial number or a code unique to the specific cartridge, is read from the NVM 814 or RFID 820 to identify the cartridge, its type and related parameters and specification information. The NVM 814 may also store information about a change in temperature of a plurality of soldering tips over time, similar to the graphs of FIGS. 3A, 3B, 4A and 4B. Once a specific soldering tip is used, the information about the change in temperature of the tip being used is retrieved form the NVM. Typically, during a soldering event, the temperature of the tip drops as it heats the solder joint and thus the heater needs to reheat the tip, which often results in overshooting the required (set) temperature for the tip. However, in some embodiments, a temperature sensor 818 periodically senses the temperature of the tip and feeds the information to the processor (or directly to the heater 808) to adjust the temperature in case of any temperature drop (or increase) due to the load or other factors. This way, an appropriate amount of heat is directly delivered to the solder joint.

In some embodiments, the NVM and/or the RFID stores data related to characteristics of the cartridge such as, part number, lot code, serial number, total usage, total point, tip mass/weight, tip configuration, authentication code (if any), thermal efficiency, thermal characteristic, and the like. This data may be retrieved by a processor (e.g., the internal processor 816 or an external processor) periodically at the startup and during the soldering operation. In some embodiments, the data may also be received and transmitted via wired or wireless methods.

In some embodiments, the NVM and/or the RFID of the cartridge includes all or some of the following information.
1. Temperature of the heater/tip and optionally information about a change in the temperature over time for various load sizes;
2. Tip geometry, which may include contact surface of the tip with the solder, distance of the tip from the heater, mass of the tip;
3. Thermal efficiency factor of the tip (based on mass, shape, heater, etc.);
4. Number of soldering events that have been performed by the specific tip, which may be used for traceability
5. Time of tip usage (for example, total time of the tip being usage for warranty and traceability)
6. Date of manufacturing of the cartridge
7. Serial number and identification code for the cartridge
8. Part-number
9. CV selection flag (whether the tip and/or cartridge is subject to CV technology)
10. Data Checksum Tip temperature, tip geometry and thermal efficiency are used to calculate an approximation for the IMC layer thickness, as explained below. Number of soldering events, time of tip usage and date of manufacturing can be used to further refine the process of IMC thickness calculation, as explained below. The historical information, such as usage time, number of soldering events and the like may be written back to the NVM to be accumulated.

Serial number, part number and CV selection flag are for housekeeping, traceability and/or determination of whether the process will can/should provide a valid indication of the IMC formation. Data checksum may be used to determine if there is a failure in the NVM or communication data transfer error, in some embodiments. In some embodiments, the intelligent cartridge for a robot soldering station includes an anti-rotation D ring for preventing the cartridge from unwanted rotations, when the robot arm is being rotated.

Figure 5:
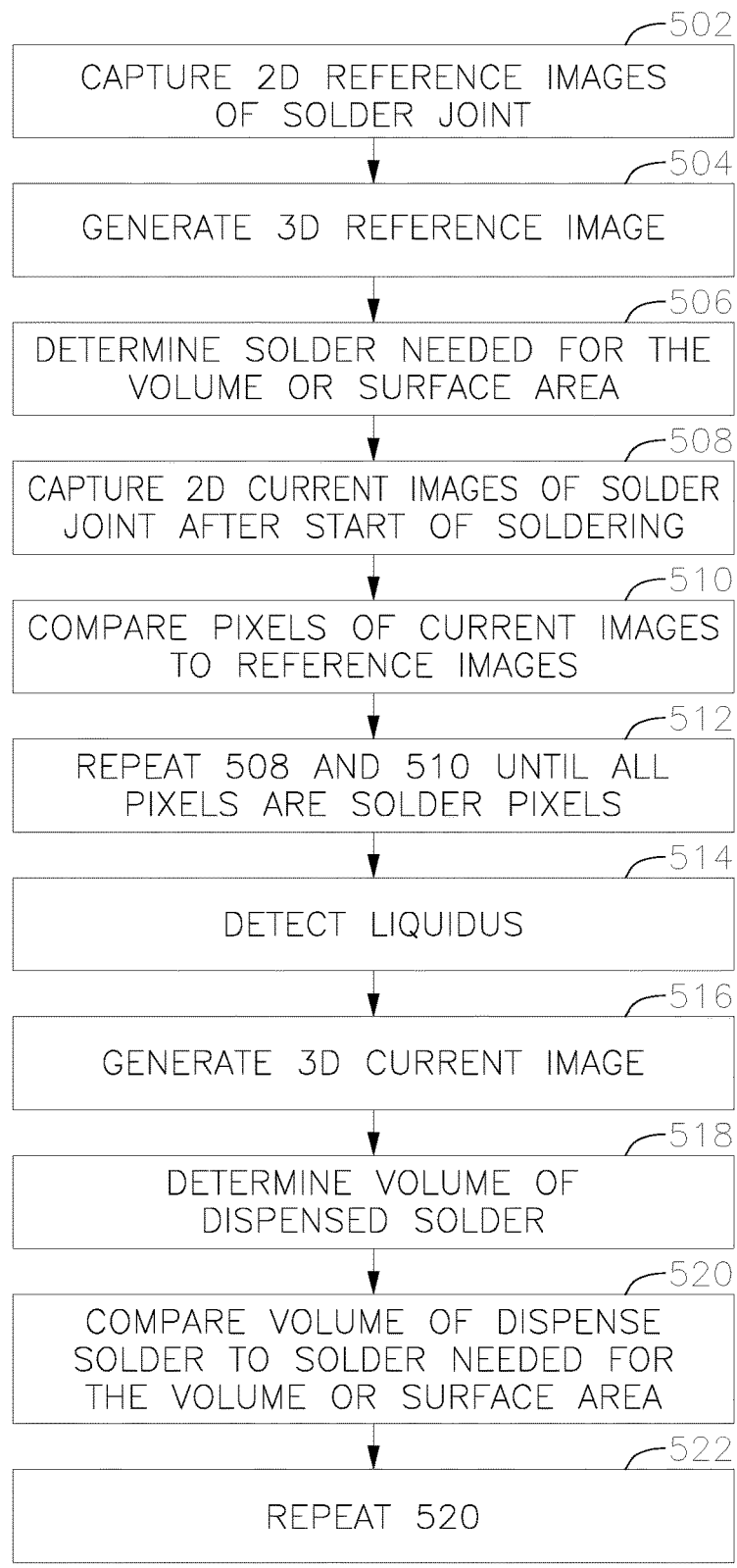
FIG. 5 is an exemplary process flow for liquidus detection and connection verification using images from a plurality of cameras, according to some embodiments of the present invention.

In some embodiments, the intelligent soldering cartridge is capable of performing the processes of liquidus detection and connection verification according to both process flows of FIGS. 2 and 5. For example, the processor 816 is capable of retrieving the information about characteristics of the cartridge from the NVM or RFID, detecting liquidus occurrence at a solder joint, receiving a 3D current image of the solder joint, determining volume of the dispensed solder after occurrence of the liquidus from the 3D current image, comparing the volume of the dispensed solder to an amount of solder needed to fill in a barrel of a hole for a through hole component, or to fill in a surface of a barrel of a hole for a surface mount component to determine how much of the dispensed solder is dissipated onto the barrel or on the surface area of the barrel, repeating the comparing of the volume of the dispensed solder until the dispensed solder has filled the barrel or the surface area of the barrel, and generating an indication signal indicating that a reliable solder joint connection is formed when the dispensed solder has filled the barrel or the surface area of the barrel within a predetermined tolerance.

In addition, the processor 816 may be capable of retrieving the information about characteristics of the cartridge, detecting liquidus occurrence at a solder joint, receiving a 3D current image of the solder joint, determining volume of the dispensed solder after occurrence of the liquidus from the 3D current image, comparing the volume of the dispensed solder to an amount of solder needed to fill in a barrel of a hole for a through hole component, or to fill in a surface of a barrel of a hole for a surface mount component to determine how much of the dispensed solder is dissipated onto the barrel or on the surface area of the barrel. The processor may then repeat the comparing of the volume of the dispensed solder until the dispensed solder has filled the barrel or the surface area of the barrel, and generating an indication signal indicating that a reliable solder joint connection is formed when the dispensed solder has filled the barrel or the surface area of the barrel within the predetermined tolerance.

Figure 1B:
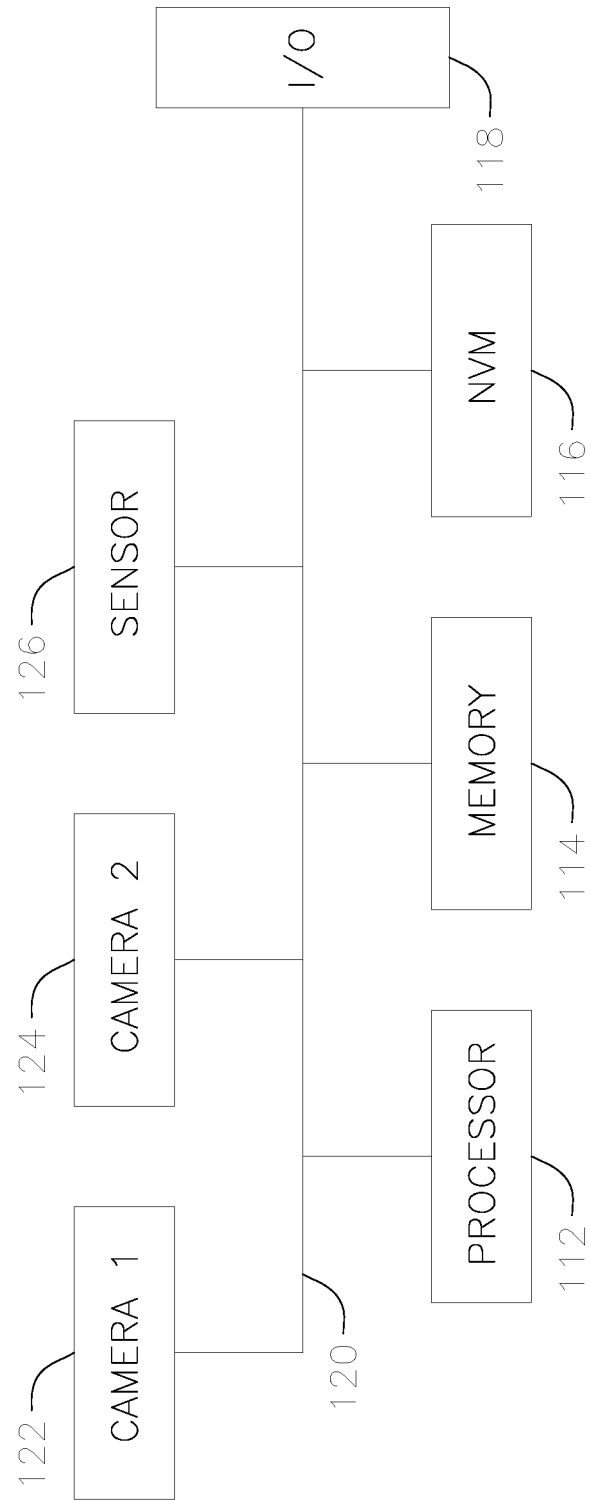
FIG. 1B is an exemplary block diagram of a processor and associated components, according to some embodiments of the present invention.

FIG. 1B is an exemplary block diagram of a processor and associated components, according to some embodiments of the present invention. As illustrated, a processor 112, a memory 114 a non-volatile memory (NVM) 116 and an I/O interface 118 are coupled to a bus 120 to comprise the processor and associated circuitry of some embodiments of the present invention. The I/O interface 118 may be a wired interface and/or a wireless interface to components external to the soldering station. Optionally, one or more cameras 122 and 124 are coupled to the processor and the memory via the bus 120 or the I/O interface 118 to capture images from a solder joint from various viewpoints. Additionally, an optional temperature sensor 126 for sensing the temperature of the soldering tip may be coupled to the processor 112 and the memory 114 via the bus 120 or the I/O interface 118. The optional temperature sensor may be located at or near the soldering tip.

As one skilled in the art would readily understand, different components depicted in FIG. 1B may be located in different parts of the soldering iron or automatic soldering station, as partly explained below. For example, the cameras may be located outside of and decoupled from the different components of the soldering iron or automatic soldering station, while the processor and associated circuitry may be located in any components of the soldering iron or automatic soldering station (as described below). The sensors may also be located in/at different components of the soldering iron or automatic soldering station, depending on their applications.

Figure 1C:
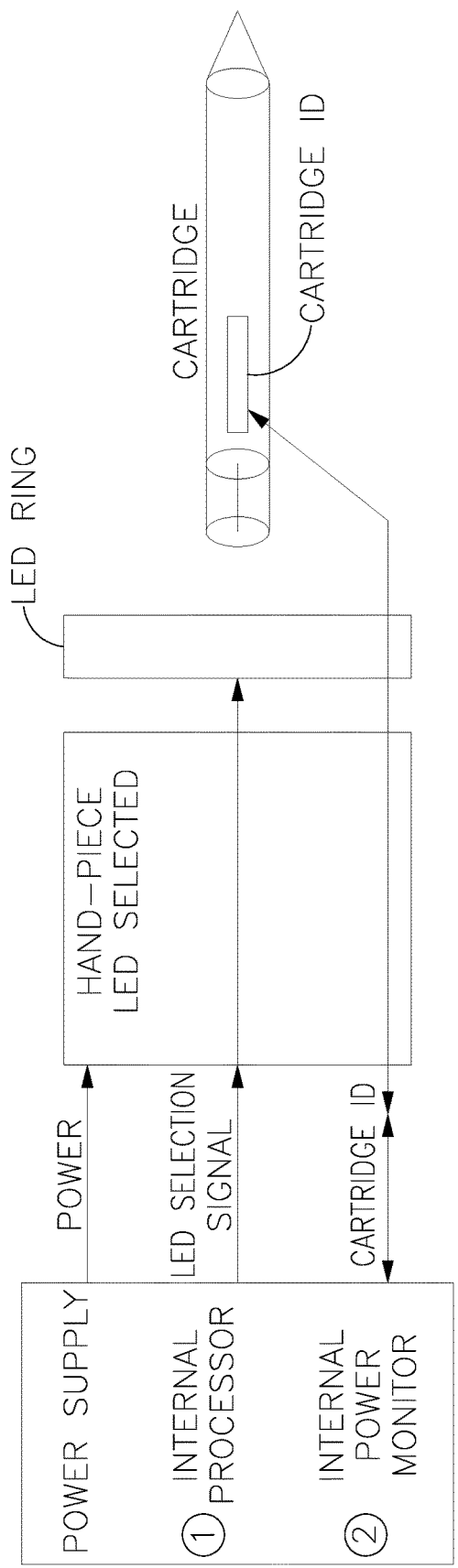
FIG. 1C depicts an exemplary handheld soldering iron where the processor and associated circuitry are in a power supply, according to some embodiments of the present invention.

FIG. 1C depicts an exemplary handheld soldering iron where the processor and associated circuitry are in a power supply, according to some embodiments of the present invention. As shown, the power supply unit includes the processor and associated circuitry and an internal power monitoring unit/circuit to detect and change the power supplied by the power supply to the handpiece, cartridge and/or the soldering tip. The power supply unit also includes wired and/or wireless interface(s) to electronically communicate with the handpiece, the LEDs, the cartridge and/or external devices. Once the processor determines the quality of the solder joint, it outputs an appropriate signal to activate one or more of an LED, a sound-emitting device, and a haptic device to notify the operator about the determined quality of the solder joint.

Moreover, the cartridge ID, for example, a serial number or a code unique to the specific cartridge, is read from the memory (e.g., NVM or RFID) of the cartridge to identify the cartridge and its type. This may be done by a wired or wireless connection. For instance, in the case of an RFID within the cartridge, the RFID (or even the NVM) may be read (by the processor) wirelessly. Once the intelligent soldering cartridge and its type are identified, the relevant parameters of the cartridge are retrieved by the processor from a memory, for example, an EEPROM. The memory that stores the cartridge related parameters may be in or outside of the cartridge. In some embodiments, if all of the related (cartridge) parameters are stored in a memory (which is in the cartridge), the cartridge may not need to be specifically identified since the parameters are already available in the memory of the cartridge and are specific to the cartridge.

In some embodiments, the cartridge may have a barcode, a magnetic stripe or a "smart chip" to identify the cartridge. Once the cartridge is identified, the relevant information may be read from the barcode, the magnetic stripe, the smart chip or fetched from an outside storage, such as a memory or a database coupled to a computer network, such as the Internet. For the purpose of the present application and the claimed invention, a storage device would also include a barcode, a magnetic stripe and a smart chip.

Figure 1D:
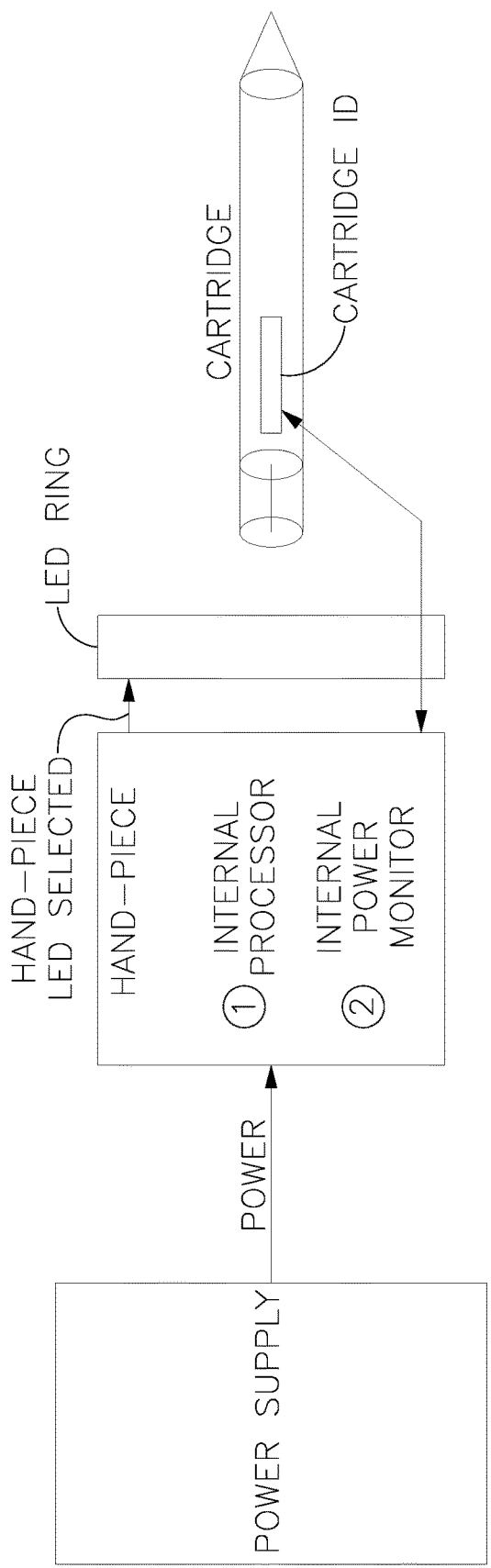
FIG. 1D shows an exemplary handheld soldering iron where the processor and associated circuitry are in a handpiece, according to some embodiments of the present invention.

FIG. 1D shows an exemplary handheld soldering iron where the processor and associated circuitry are in the handpiece, according to some embodiments of the present invention. The general functions and operations of these embodiments are similar to those explained with respect to FIG. 1C, except that the processor (and associated circuitry) and the power monitor unit/circuit are now located with the handpiece.

Figure 1E:
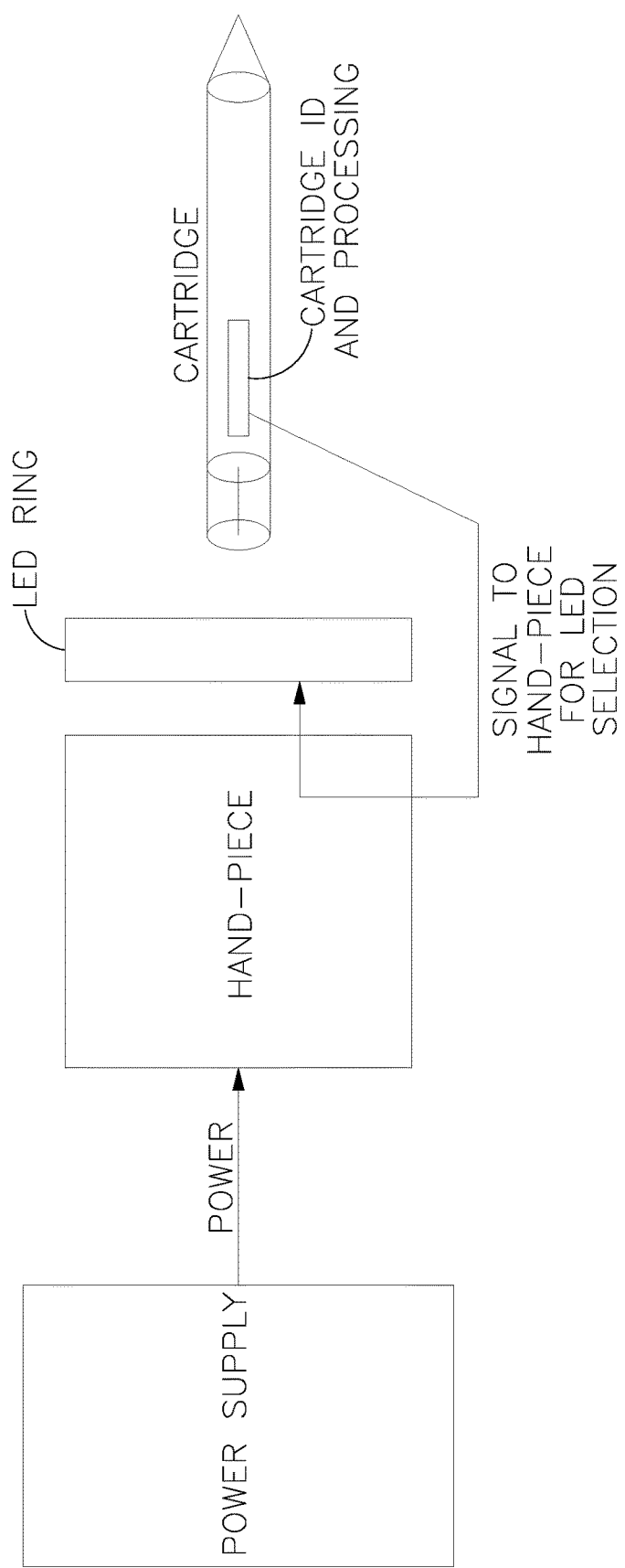
FIG. 1E illustrates an exemplary handheld soldering iron where the processor and associated circuitry are in a cartridge, according to some embodiments of the present invention.

FIG. 1E illustrates an exemplary handheld soldering iron where the processor and associated circuitry are in a cartridge, according to some embodiments of the present invention. In these embodiments, the cartridge may be similar to the intelligent cartridge depicted in FIG. 8 and explained above. The general functions and operations of these embodiments are similar to those explained with respect to FIG. 1C, except that the processor (and associated circuitry) and the memory are now located with the cartridge. Again, the communications between the cartridge, the handpiece and external devices may be wired and/or wireless. As one skilled in the art would readily recognize, the power monitoring unit/circuit (not shown) may be located in the power supply unit, the handpiece or the cartridge itself. In these embodiments, the devices that notify the operator (e.g., LEDs, sound-emitting device, and/or haptic devices) may be located with the handpiece or the cartridge itself. If located with the handpiece, the handpiece includes a wired and/or wireless interface to communicate with the cartridge (and any relevant external devices).

Figure 1F:
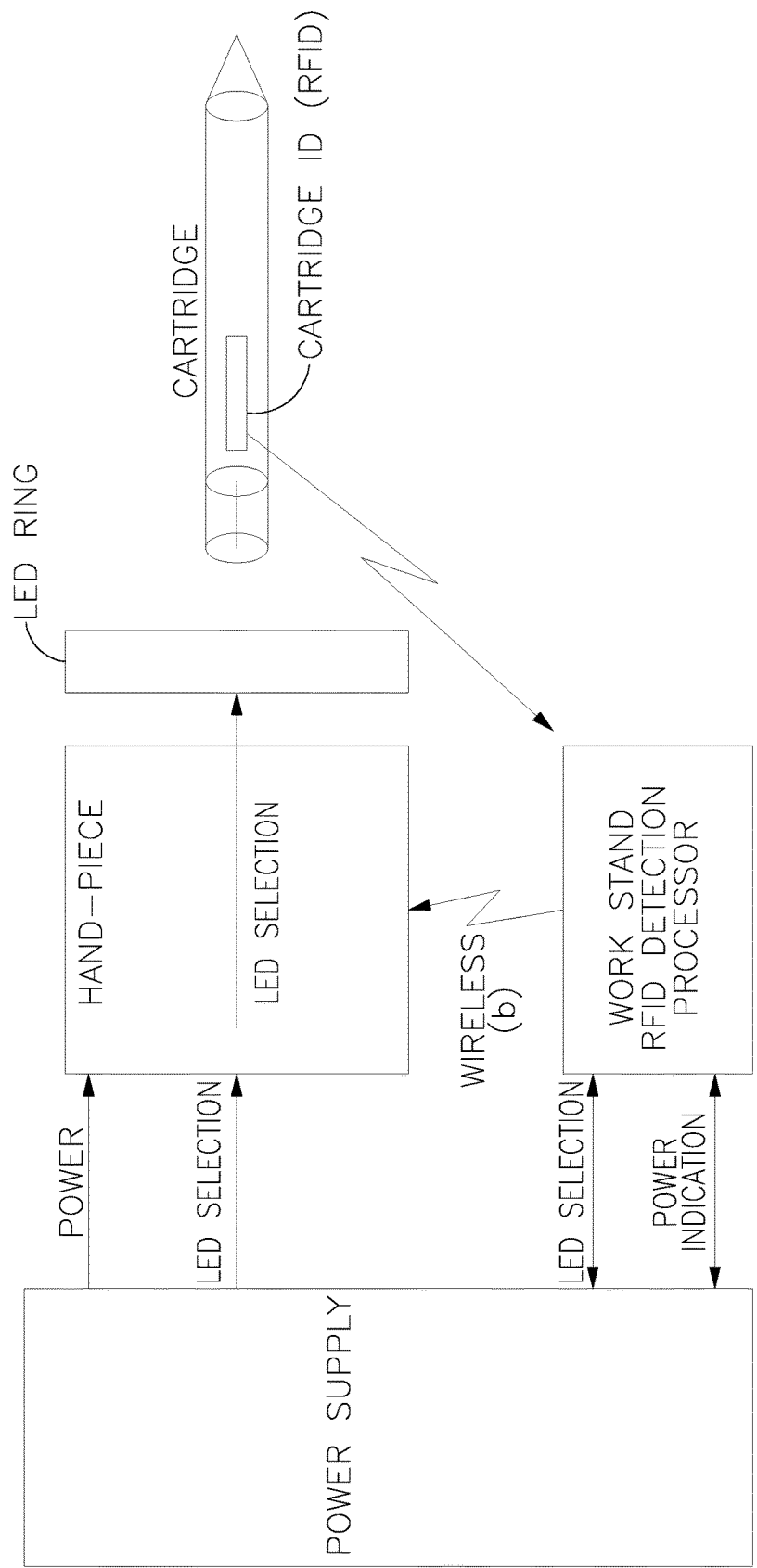
FIG. 1F shows an exemplary handheld soldering iron where the processor and associated circuitry are in a work stand, according to some embodiments of the present invention.

FIG. 1F illustrates an exemplary handheld soldering iron where the processor and associated circuitry are in a cartridge, according to some embodiments of the present invention. The general functions and operations of these embodiments are similar to those explained with respect to FIG. 1C, except that the processor (and associated circuitry) and the power monitor unit/circuit are now located with the work stand of the soldering iron.

Figure 1G:
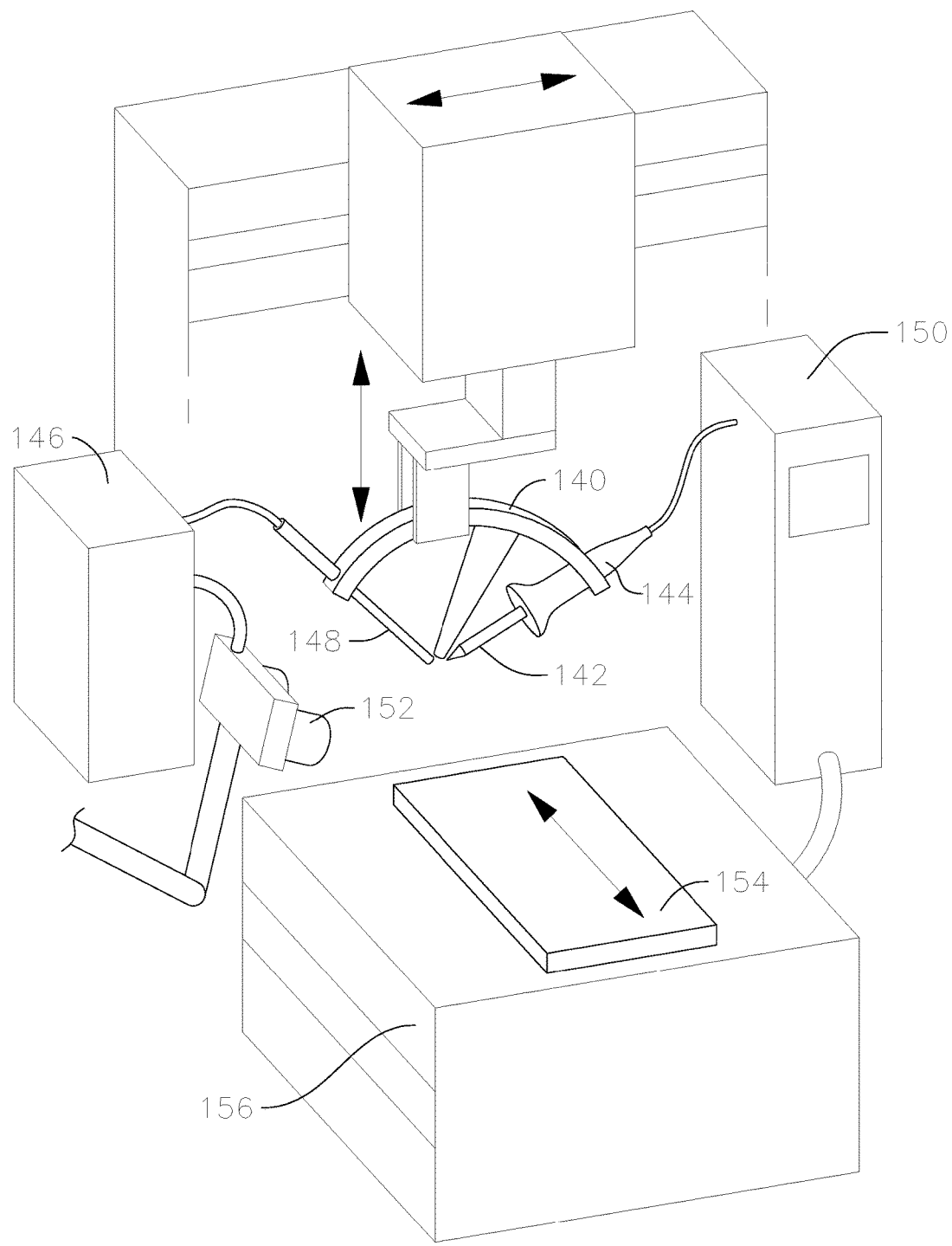
FIG. 1G depicts an exemplary automatic soldering station, according to some embodiments of the present invention.

FIG. 1G shows an exemplary automatic soldering station, according to some embodiments of the present invention. In these embodiments, the handpiece and the cartridge are assembled on or part of a robot arm as shown. As shown, a robot arm 140 is capable of three-dimensional movements and rotations. A hand-piece 144 is coupled to the robot arm and an intelligent soldering cartridge, for example, an intelligent soldering cartridge according to FIG. 8 is connected to the hand-piece. In some embodiments, the intelligent soldering cartridge 142 may be directly coupled to the robot arm 140, which would be acting as the hand-piece.

A work piece 154, such as a printed wiring board (PWB), is placed on a moving platform 156 to have a soldering operation performed thereon. A solder feeder 146 provides solder to the work piece 154 via a grip, anchor, roller or tube 148. One or more cameras 152 placed at different angles capture the close up of the solder joint on the work piece. A power supply 150 provides power to the cartridge and related electronics therein.

This way, the CV technology of the present invention is capable of providing feedback (a closed-loop system) to any conventional automatic soldering station. For example, the open-loop time based event of the conventional approaches is significantly improved by providing a real-time feedback of the solder quality. That is, instead of using a prescribed time for a solder joint, the CV technology provides the robot motion control system with a feedback signal that indicates when a good joint has been made. In some embodiments, only upon the indication of a good joint, the robot can move to the next joint in the program. When a bad joint has been made, the robot stops immediately or at the end of the program and alerts the operator of an issue with the solder joint.

FIG. 2 shows an exemplary process flow, according to some embodiments of the present invention. As shown in block 202, the process for validating all the connection joints between the component and the PCB substrate starts. In block 204, the cartridge being used is identified and the data related to the identified cartridge is retrieved from a non-volatile memory (NVM), such as an EEPROM, in the cartridge or outside of the cartridge. As described above, in some embodiments, the data related to the identified cartridge is retrieved, by the processor, from the NVM in the cartridge.

In block 206, the process (e.g., processor) checks the power level to determine whether any soldering action is being performed, within a period of time. If no soldering action to be performed yet, the process waits in block 206. For example, a timer can be set to a predetermined time and if no action happens within that time, the process waits.

However, if a soldering action is to be performed, the process proceeds to an optional block 208, where the indicators are reset.

FIG. 3A shows a graph for a change in temperature of a soldering tip over time, for three given solder load sizes. As describe above, this data may be stored in the memory of the cartridge. Graph 306 is for a large load size (e.g., ~104 Cu Mil$^2$), graph 304 is for a medium load size (e.g., ~54 Cu Mil$^2$) and graph 302 shows a small load size (e.g., ~24 Cu Mil$^2$). As illustrated in FIG. 3A, for a given tip, the heavier the load, the higher temperature drop. In some embodiments, if the tip temperature drop is greater than a predetermined value, for example, around 25° C. (determined by experimental data), the process is aborted since the power supply would be unable to recover fast enough to continue delivering power to the tip to maintain the temperature of the tip, within the required time to complete the soldering event (e.g., 8 seconds).

In some embodiments, the temperature drop may be detected by measuring the impedance of the tip and then determining the tip temperature by Equation (3) below. The impedance may be measured by turning off the power to the cartridge/tip and measuring the voltage of the coil (in the cartridge) that is in thermal contact with the tip. The impedance of the tip would then be the voltage of the coil times an impedance weight factor (K in Equation (3)), which would depend on the tip type and is stored in a memory, for example, in the cartridge itself. In some embodiments, a temperature sensor may be placed in the cartridge to directly read the temperature drop of the tip and communicate it to the microprocessor.

$$R_{imd} = R_{min} + R_{max}/(1 + [k*e^{\hat{}}(-T)]) \quad (3).$$

Where, $R_{imd}$ is the impedance value, $R_{min}$ is a minimum value of the impedance, $R_{max}$ is a maximum value of the impedance, K is a weight factor and T is delta temperature, that is the temperature difference between the tip and the load. The tip temperature drop is typically due to heat transfer from tip to load at the beginning and could vary from 6° to 48° depends on tip geometry, heater, and type of the tip. Rmin is the minimum impedance value for the solder tip, before power is on at startup. Rmax is the maximum impedance value for the solder tip, after power is on at startup for a predetermined amount of time, for example, after 2 seconds. These values are specific to the specific solder tip that is being used and are stored in a memory accessible by the processor.

FIG. 3B depicts a graph for a change in impedance of a soldering tip over time, for three given power levels that are delivered by the power supply unit to the soldering tip and three given temperatures of the soldering tip. As explained above, this data may also be stored in the memory of the cartridge. Graph 318 is for a small power, graph 312 is for a large power and graph 314 shows a medium power. Moreover, graph 310 is for a small, graph 316 is for medium temperature and graph 320 is for a large temperature.

In some embodiments, the temperature drop may be detected by defining a thermal efficiency factor for each given tip geometry and heater material (stored in a memory, in the cartridge or outside of the cartridge), as shown in Equation (4) below. If power draws higher than TE_factor, the system determines an abort in the process by, for example, turning on a red LED, activating a haptic device, or activating a sound-emitting device.

$$TE\_factor = TipMass*TipStyle*HTR\_factor*Const \quad (4),$$

where, TipMass is the copper weight (mg), which is 0.65 for a LongReach tip, 1 for a Regular tip, and 1.72 for a Power tip. TipStyle refers to the distance from the tip of tip to the heater in the cartridge. For example, according to data for some soldering tips currently available in the market, TipStyle is 20 mm for a "LongReach" tip, 10 mm for a "Regular" tip, and 5 mm for a "Power" tip. HTR_factor is the heater temperature times a factor (e.g., 0.01), which is given (predetermined), based on the type of the heater. Const=4.651*10$^{-3}$ for all types of heaters. For instance, the HTR_factor may be 800 F*0.01=8; 700 F*0.01=7; 600 F*0.01=6; or 500 F*0.01=5 for various heater types. These parameter values may be stored in a memory (e.g., NVM) of the soldering iron, soldering station, or within the cartridge itself.

Referring back to FIG. 2, in block 210, a thermal efficiency check is performed to ensure that the tip geometry/temperature and the load are matched, based upon tip temperature drop within a predetermined time period, for example, the first 2-3 seconds of the soldering event (e.g., according to Equations (3) or (4), or a temperature sensor). For instance, there is a match when the max power after 2 seconds from the start of the soldering is less than or equal the thermal efficiency factor of the solder tip being used. The parameters may be retrieved from the NVM.

In some embodiments, the thermal efficiency check process monitors the heat transfer and power recovery of the soldering station with respect to the tip and the load. Each tip type has its own thermal characteristic, which is a function of the tip temperature, mass, and configuration/style. For various tip types, their thermal characteristic and efficiency factors (TEs) are stored in a memory in the cartridge or outside of the cartridge.

During the first period of time (e.g., 2-3 seconds), the power to the tip is measured (e.g., from the power supply) and compared with the TE of the tip. If the measured power is greater than a threshold value, for example, 95%+/−10% of TE factor, it means that the tip is too small or the load is too large, because they require a lot of power. In this case, the thermal efficiency check fails (210a), the process is aborted in block 226 and optionally one or more indicators, for example, a red LED, a haptic device and/or a sound-emitting device, are turned on. If the thermal efficiency check passed (210b), the process proceeds to the optional block 212 where a passing indicator, such as a green LED and/or a beep, is turned on to let the operator or the robot program know that the thermal efficiency check process has passed.

In block 214, the liquidus temperature is detected based on the following heat transfer equation.

$$\Delta T = P*TR \quad (5),$$

where, $\Delta T$ is the tip temperature minus the load temperature, P is the (electrical) power level to the tip, and TR is the thermal resistance between the tip and the load that may be retrieved from the NVM.

Since load temperature continues to increase until it reaches equilibrium, $\Delta T$ decreases throughout the soldering action. Also, power to the tip increases when the soldering event first starts. Therefore, TR will be decreasing, as shown below. Once liquidus occurs, TR is stabilized and thus the power to the tip P now starts decreasing, as shown below. Accordingly, to detected liquidus temperature, the change state in the power delivered to the soldering tip is observed.

$$\Delta T\downarrow = P\uparrow *TR\downarrow$$

$$\Delta T\downarrow = P\downarrow *TR\sim$$

In block 216, it is checked to see if the power is at a peak and declining. If not, the process is timed out (216*a*) and aborted in block 226. If the power to the tip, measured from the power supply, is at a peak and declining, the process proceed to block 218 to turn on an indicator, for example, an LED and/or a beep sound. When the power is at a peak and declining, it means that the solder event is at liquidus state.

In block 220, the thickness of the IMC is determined by the following equation.

$$IMC = 1 + (k^* \ln(t+1)) \quad (6),$$

where k is a weight factor for the type of solder being used (provided by the manufacturer of the solder and stored in the memory) and t is the sample/sensing interval time, for example 100 ms to determine the IMC thickness at a given time after liquidus. For example, K is constant with a value of 0.2173, t is 0.1 second, that is, IMC is calculated at 0.1 s intervals to avoid over shooting for small loads. That is, the tip cools as it heats the solder joint and as the heater tries to reheat the tip, the temperature may be overshooting from its set (desired) value. Typically, the thickness of the IMC may vary between 1-4 um.

Generally, the thickness of the IMC of the solder joint would be a function of time and temperature. When the temperature is at melting point of the solder load (e.g., at 220-240° C.), it does not have a substantial impact on the thickness of the IMC of the solder joint. Accordingly, Equation (6) is based on only time and a fixed temperature.

Figure 4A:
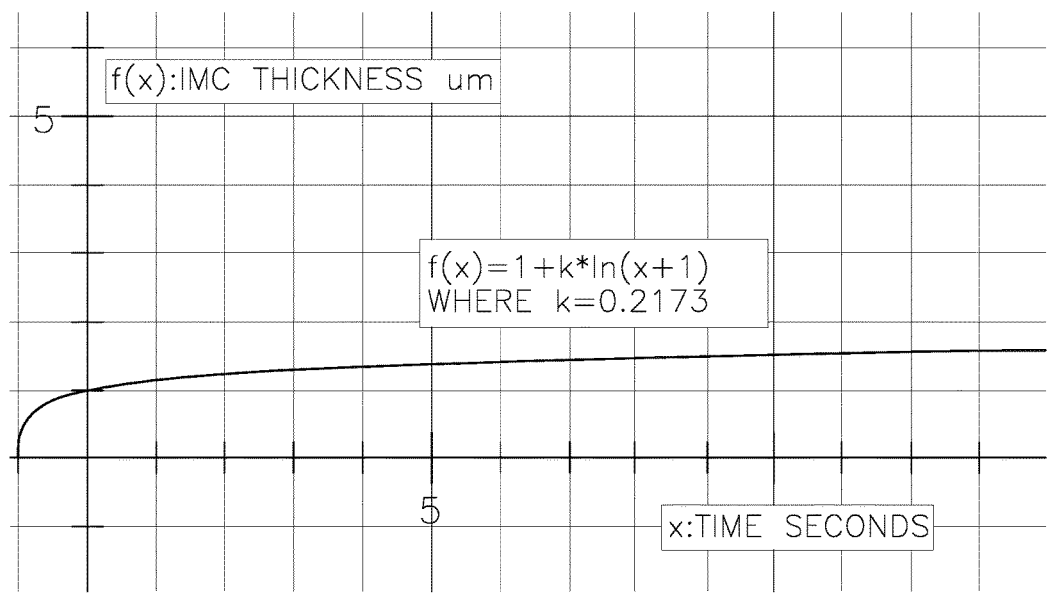
FIG. 4A illustrates a graph for the thickness of the IMC versus time, according to some embodiments of the present invention.

FIG. 4A illustrates a graph for the thickness of the IMC of the solder joint versus time, for the weighing factor k=0.2173, which is obtain by experimentation, using many solder joint and IMC thickness measurements. As depicted in FIG. 4A, the IMC thickness increases over time, based on experimental data.

Referring back to FIG. 2, block 222 checks to see whether within a predetermine amount of time (cooling period), the determined thickness of the IMC is within a predetermined range, for example, 1 um to 4 um. If it is, the processes proceeds to block 224, where the operator is informed. If the result of the test in block 222 is false, the process is timed out (222*b*) and aborted in block 226.

In some embodiments, the invention provides the operator with an indication of successful or potential non-successful joint formation, along with the ability to collect the intermetallic joint information, and the operational parameters for that particular joint for post processing. Indication can be accomplished via visual means, audible means, and/or vibration of the handpiece.

A debug mode (block 228) is used, for example, by a process engineer to keep track of the steps involved during a solder event. To enter the debug mode, a user needs to turn the debug mode on.

Figure 4B:
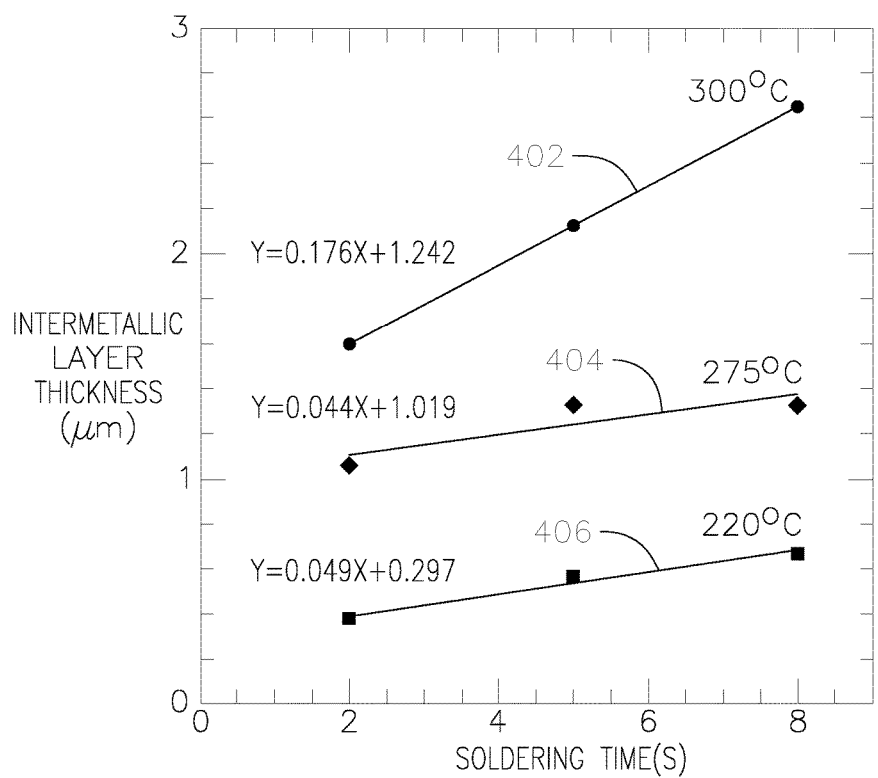
FIG. 4B illustrates a graph for the thickness for the IMC versus soldering time, according to some embodiments of the present invention.

FIG. 4B illustrates a graph for the thickness for the IMC versus soldering time. As depicted, graph 402 is for a temperature of 300° C. with Y=0.176X+1.242, graph 404 is for a temperature of 275° C. with Y=0.044X+1.019, and graph 404 is for a temperature of 220° C. with Y=0.049X+0.297, where X is the time and Y is the IMC thickness. The constant numbers are derived from multiple experimentations. As shown, a break out of the IMC thickness happens at three different temperature ranges. Since the thickness of the IMC is a function of time and temperature, as temperature rises, the IMC grows larger, as a linear function. Depending on the application, any of these curves may be used to determine the weighing factor, K, in Equation (6). For example, for a soldering application with SAC305 tip (the specification of which may be stored in the NVM of the cartridge), graph 404 is used.

Figure 4C:
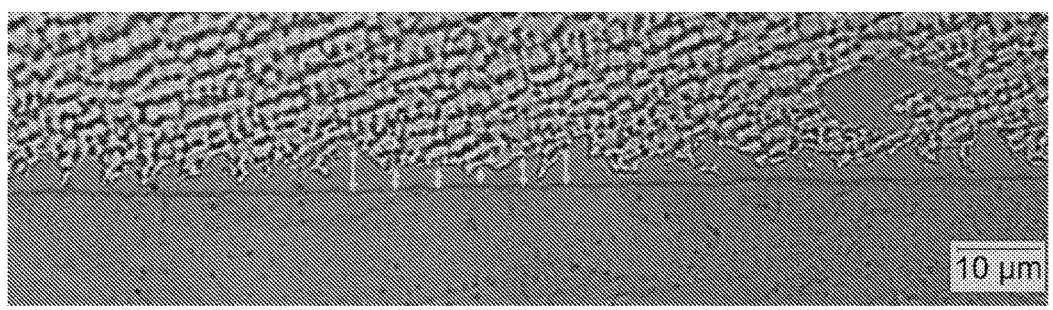
FIG. 4C shows an IMC layer for a soldering event.

FIG. 4C shows an IMC layer with a scale of 10 um. The vertical arrows are where the IMC thickness measurement may be performed. As described above, the present invention detects liquidus temperature, determines the thickness of the IMC and ensures that a desired thickness is achieved.

This way, the embodiments of the present invention ensure a good bonding and electrical connection between two metals by calculating the intermetallic thickness and therefore prevent a bad joint in early stages. Moreover, the invention provides instant feedback (by the indicators) to operators on joint quality and process issues and thus the operators have the ability to track information on joint quality for post analysis. The operators can change or select from a menu different parameters to meet certain application requirements.

In some embodiments, when a self-regulated temperature feedback technology is utilized, there is no requirement for calibration of the system at customer site. The invention also provides the capability to help the operators to identify whether they are using an improper tip/cartridge combination for a soldering event. For example, the invention is capable of informing the operator (e.g. Via LED, sound-emitting device, haptic device, etc.), when the solder tip is not capable to deliver sufficient energy required to bring the load to a melting point after a predetermined time (e.g., 2 seconds) from the startup based on the thermal efficiency threshold stored in NVM.

In some embodiments, the invention uses at least two high resolution cameras to capture two or more 2D images, obtain a 3D image from those 2D images (utilizing various known techniques), use the 2D and 3D images to detect liquidus stage and then calculate the amount of solder filled through the via hole (barrel) for through hole components, or the amount solder spread out around the components for surface mount components.

FIG. 5 is an exemplary process flow for liquidus detection and connection verification using images from a plurality of cameras, according to some embodiments of the present invention. In some embodiments, at least two high resolution cameras are placed close to the solder joint at two different locations to capture 2D images of the solder joint from two views (angles), before and after the soldering event. The liquidus is detected from comparison of the 2D images. Then, in the case of through hole components, the volume of the through hole barrel (barrel) is determined from 3D images generated from the 2D images. In the case of surface mounted (SMT) components, the surface of the barrel on the PCB is determined from the 2D images. As shown in block 502, two images of the soldering area (joint) are captured by the two cameras, before the soldering event to generate two reference images, as depicted in FIG. 6A. In block 504, a 3D reference image of the soldering area is generated from the two reference images, before the soldering event, by well know methods.

In block 506, the volume of the barrel $V_b$ for through hole and/or the surface area of the barrel $S_b$ for SMT component are determined from the 3D reference image to determine how much solder is need to fill the barrel or the surface area of the barrel. The surface of the barrel may also be determined from the 2D images, depending on the cameras positions. For example, knowing the distance and the angle of each camera to the solder joint, the distance of any point (e.g., points on the perimeter of the barrel surface) may be determined, using simple known trigonometry. Also, having a second (stereo) camera, provides at lea four points to be used for volume determination. There are also known software tools (e.g., computer vision software) that are capable of measuring the volume (and surface areas) from 3D images. For example, Image-Pro Premier 3D™ and Image-Pro Plus™ from MediaCybernetics™ is capable of measuring the properties of multiple materials within a volume and easily discover percent composition, material mass, orientation, diameter, radii, and surface areas. The tool is capable of measuring object volume, box volume, depth, diameter, radii, and surface area. Several other tools with similar functionalities are also available and know to one skilled in the art.

Accordingly, the amount of solder needed to fill in the barrel or the surface of the barrel is determined, depending on the type of the component. Immediately after the soldering event is started, two current images of the soldering area is captured, in block 508. In block 510, the color value of each pixel in the 2D reference images is compared to color value of each corresponding pixel in the 2D current images, as the soldering event progresses, to detect any color changes of the pixels in the current images due to spread of the solder. Since the pixel value of the solder color is known, this the process can determine whether a pixel is a solder pixel, i.e., contains solder, as shown in FIG. 6B.

In block 512, the processes in blocks 508 (FIG. 6C) and 510 are repeated until all the pixels in the current images are determined to be pixels of the dispensed solder, that is, the liquidus is now detected, as depicted in FIG. 6D. The process in block 512 is timed out after a predetermined amount of time (e.g., 8 seconds), if not all the pixels in the current images are determined to be pixels of solder. When all the pixels in the last two current images are determined to be pixels of the dispensed solder (within a tolerance range), the liquidus is detected, in block 514.

After the detection of the liquidus, the last current image from each camera are processed to generate a 3D current image, in block 516. Then, the volume of the dispensed solder $V_s$ is determined from the 3D current image, by one or more of Equations (7) to (9), in block 518. In block 520, the calculated volume of the dispensed solder $V_s$ is compared to the determined amount of solder needed to fill in the barrel (i.e., $V_b$) or the surface area of the barrel (i.e., $S_b$) to determine how much of the dispensed solder is dissipated into the barrel or on the surface area of the barrel. This process (block 520) is repeated in block 522, until the dispensed solder has filled the barrel or the surface area of the barrel. That is, the volume of the visible dispensed solder has reached ($V_s$ Vb) or ($V_s$ $S_b$), within a predetermined tolerance range. The process in block 522 is timed out after a predetermined amount of time (e.g., 8 seconds). An indicator (e.g., a LED and/or beep) is then turn on to notify the operator that the connection is now formed by filling all of the barrel or the surface of the barrel with the dispensed solder.

In other words, in the case of a through hole component, when the calculated volume reduces to a predetermined amount that is needed to fill the barrel and within a predefined tolerance for through hole component, a good solder joint is formed, as shown in FIG. 7A. In some embodiments, the calculation of the height and volume of the solder joint is performed based on the following equations.

$$V_{lead} = \pi r_{lead}^2 h \quad (7)$$

$$V_{barrel} = \pi r_{barrel}^2 h \quad (8)$$

$$V_{required} = \pi h(r_{barrel}^2 - r_{lead}^2) \quad (9)$$

Where, $V_{lead}$ is the volume of component lead; $V_{barrel}$ is the volume of through hole barrel; $V_{required}$ is the volume of solder required to fill the barrel, $r_{lead}$ is the (though hole) component lead radius; $r_{barrel}$ is through hole barrel radius; and h is the board thickness, as shown in FIG. 7A.

FIG. 7A shows some exemplary solder joints, the image of which is captured by the two cameras, for through hole components, according to some embodiments of the present invention. FIG. 7B shows some exemplary solder joints, the image of which is captured by the two cameras, for surface mount components, according to some embodiments of the present invention. In this case, the invention compares the height of the entire load to a predetermined reference height (a desired height) to form a parabolic or linear shape. Once the identified shape area is equivalent to a predefined percentage of the load (barrel) surface area within a predefined tolerance, a good solder is formed for the surface mount component. As shown in FIG. 7B, for a larger surface mount component, the solder joint is formed on the side of the component as a parabolic shape. However, for a smaller surface mount component, the solder joint is formed on the side of the component as a linear shape since the camera can only capture a linearly filled area due to the small size of the component.

It will be recognized by those skilled in the art that various modifications may be made to the illustrated and other embodiments of the invention described above, without departing from the broad inventive step thereof. It will be understood therefore that the invention is not limited to the particular embodiments or arrangements disclosed, but is rather intended to cover any changes, adaptations or modifications which are within the scope and spirit of the invention as defined by the appended claims.

What is claimed is:

1. An intelligent soldering cartridge comprising:
    a housing;
    a solder tip;
    a processor for determining a thickness of an intermetallic compound (IMC) of a solder joint being formed by the solder tip, and generating an indication signal indicating that a reliable solder joint connection is formed when the thickness of the IMC is within a predetermined range; and
    an interface for transmitting the indication signal.

2. The intelligent soldering cartridge of claim 1, further comprising a storage device for storing information about characteristics of the cartridge, wherein the processor determines the thickness of the IMC using some of the retrieved information and an amount of power delivered to the solder tip.

3. The intelligent soldering cartridge of claim 2, wherein the storage device comprises one or more of non-volatile memory (NVM) and a radio frequency identification device (RFID).

4. The intelligent soldering cartridge of claim 2, wherein information about characteristics of the intelligent soldering cartridge includes one or more of a part number, a serial number, an indication of time of usage of the intelligent soldering cartridge, a mass of the solder tip, a solder tip configuration, an authentication code, thermal characteristics of the solder tip, information about a change in the temperature of the solder tip over time for various load sizes, contact surface of the solder tip with solder, distance of the solder tip from the heater, number of soldering events that have already been performed by the solder tip, total usage time of the solder tip, and date of manufacturing of the intelligent soldering cartridge.

5. The intelligent soldering cartridge of claim 1, further comprising a heater for heating the solder tip.

6. The intelligent soldering cartridge of claim 1, wherein the processor determines the thickness of the IMC by monitoring an amount of power delivered to the solder tip.

7. The intelligent soldering cartridge of claim 1, further comprising a temperature sensor for measuring a temperature of the solder tip.

8. The intelligent soldering cartridge of claim 7, wherein the temperature sensor periodically measures the temperature of the solder tip and feeds the information to the processor, and wherein the processor adjusts the temperature of the solder tip when said temperature changes from a predetermined value.

9. The intelligent soldering cartridge of claim 1, wherein the interface is one or more of a wired interface and a wireless interface.

10. A handheld soldering iron including the intelligent soldering cartridge of claim 1 for soldering work pieces.

11. An automatic soldering station including the intelligent soldering cartridge of claim 1 for soldering work pieces.

12. An intelligent soldering cartridge comprising:
a housing;
a solder tip;
a heater for heating the solder tip;
a processor for determining an amount of a dispensed solder for a solder joint from an image of the solder joint being soldered by the intelligent soldering cartridge, comparing the amount of the dispensed solder to an amount of solder needed for the solder joint to determine how much of the dispensed solder is dissipated onto the solder joint, and generating an indication signal indicating that a reliable solder joint connection is formed when the dispensed solder has filled the solder joint within a predetermined tolerance; and
an interface for transmitting the indication signal.

13. The intelligent soldering cartridge of claim 12, wherein the image of the solder joint is a three-dimensional image generated from two or more two-dimensional images.

14. The intelligent soldering cartridge of claim 12, wherein the storage device is one or more of non-volatile memory (NVM) and a radio frequency identification device (RFID).

15. The intelligent soldering cartridge of claim 12, wherein information about characteristics of the cartridge includes one or more of part number, serial number, total usage of the cartridge, solder tip mass, solder tip configuration, authentication code of the cartridge, thermal characteristics of the solder tip, information about a change in the temperature of the solder tip over time for various load sizes, contact surface of the solder tip with solder, distance of the solder tip from the heater, number of soldering events that have already been performed by the solder tip, total usage time of the solder tip, and date of manufacturing of the cartridge.

16. The intelligent soldering cartridge of claim 12, wherein the interface is one or more of a wired interface and a wireless interface.

17. The intelligent soldering cartridge of claim 12, further comprising a temperature sensor for measuring a temperature of the solder tip.

18. The intelligent soldering cartridge of claim 17, wherein the temperature sensor periodically measures the temperature of the solder tip and feeds the information to the processor, and wherein the processor adjusts the temperature of the solder tip when said temperature changes from a predetermined value.

19. A handheld soldering iron including the intelligent soldering cartridge of claim 12 for soldering work pieces.

20. An automatic soldering station including the intelligent soldering cartridge of claim 12 for soldering work pieces.

* * * * *